United States Patent [19]

Richardson

[11] 4,388,632

[45] Jun. 14, 1983

[54] SIGNAL LIMITING INTEGRATED CIRCUIT

[75] Inventor: William E. Richardson, Rutland, Mass.

[73] Assignee: Sprague Electric Company, North Adams, Mass.

[21] Appl. No.: 193,788

[22] Filed: Oct. 3, 1980

[51] Int. Cl.³ .................. H01L 27/04; H01L 29/48
[52] U.S. Cl. ................................ 357/15; 307/565; 357/48; 357/68
[58] Field of Search ............... 307/317 A, 559, 561, 307/565; 357/15, 48, 68; 330/298

[56] References Cited

U.S. PATENT DOCUMENTS

| | | | |
|---|---|---|---|
| 3,436,667 | 4/1969 | Kedson | 330/298 |
| 3,679,989 | 7/1972 | Thibodeau | 330/298 |
| 3,742,250 | 6/1973 | Kan | 307/317 A |
| 4,281,448 | 8/1981 | Barry et al. | 357/15 |

OTHER PUBLICATIONS

Hamilton and Howard, Basic Integrated Circuit Engineering, (McGraw-Hill, NY, 1975), p. 24.
Hibberd, Integrated Circuits (McGraw-Hill, NY, copyright 1969 by Texas Instruments) p. 43.

Primary Examiner—William D. Larkins

[57] ABSTRACT

A simple silicon integrated circuit consists of two identical Schottky diodes formed in epitaxial pockets that are defined by P-N junction isolation walls. Metallization is provided to connect the diodes back-to-back in parallel and to provide terminal pads at the two nodes of the parallel circuit. Another metal film makes contact with the isolation wall and has an enlarged termination pad portion. This component may be connected across the input of an A/D converter to limit input signals to a small value.

3 Claims, 3 Drawing Figures

SIGNAL LIMITING INTEGRATED CIRCUIT

BACKGROUND OF THE INVENTION

This invention relates to a silicon integrated circuit having two Schottky diodes parallel connected back-to-back for signal limiting and more particularly to such a device having wire bonding termination pads for connection of the back-to-back diodes across a pair of signal transmitting lines.

It is known to use a junction diode for clamping and limiting the voltage transmitted to the input of a sensitive amplifier or the like to prevent noise spikes or other large signals from saturating or otherwise disturbing the normal small signal handling capability of the amplifier. However, junction diodes store charge while in a state of forward conduction, limiting their turn-off speed.

It is an object of this invention to provide a low cost high speed bipolar signal limiting component.

SUMMARY OF THE INVENTION

A signal limiting integrated circuit has a silicon body of one conductivity type, a lightly doped epitaxial layer of the opposite conductivity type, and a heavily doped isolation wall of the one type forming two pockets of unaltered epitaxial material. A first metal film makes Schottky barrier contact with one of the pockets and ohmic contact with the other. A second metal film makes ohmic contact with the other pocket and Schottky barrier contact with the one pocket. A third metal film makes ohmic contact with the isolation wall. Each of the three films has an enlarged termination pad area, preferably at least 5000 square microns, to which connecting wires may be attached by standard bonding methods.

The paralleled back-to back Schottky diodes may be connected across the input of a single ended or differential amplifier to limit the input voltage of either polarity to a very small value, namely about 0.5 volts for the particular construction described here. When used at differential inputs, the third metal film may be grounded to prevent cross talk through the pocket to isolation wall capacitances from one input terminal to the other. The p-n junctions in this structure are normally prevented from conducting in the forward direction by the lower Schottky barrier junction threshold.

DESCRIPTION OF THE PREFERRED EMBODIMENT

Figure 1:
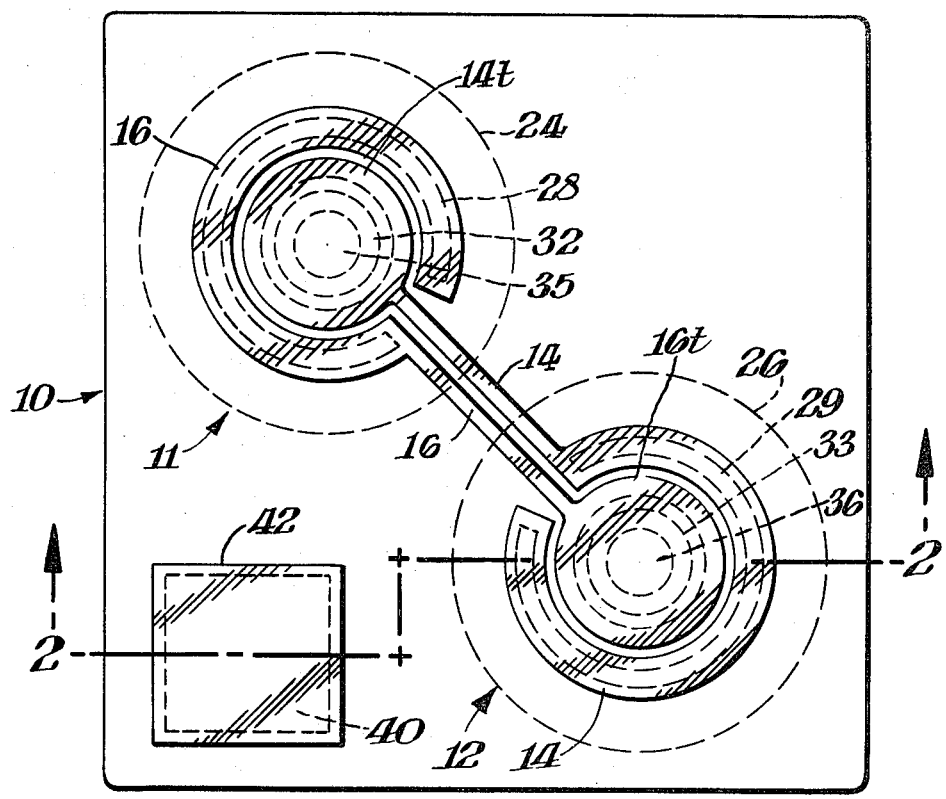
FIG. 1 shows in top view, substantially to scale, an integrated circuit of the invention.
Figure 2:
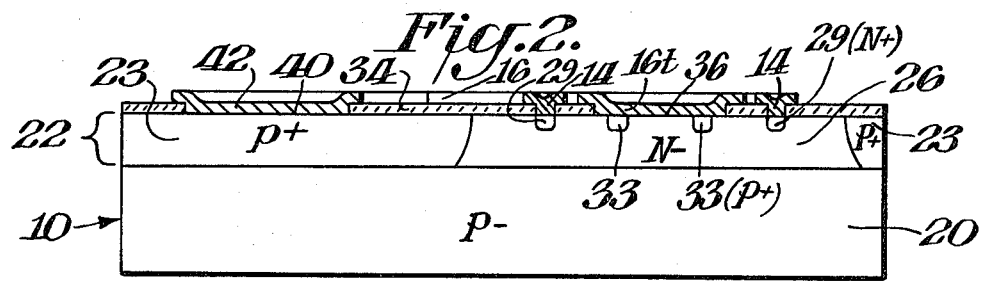
FIG. 2 shows in side sectional view taken in plane 2—2 the integrated circuit of FIG. 1.

The integrated circuit 10 of FIGS. 1 and 2 has two identical Schottky diodes 11 and 12. Metal film 14 interconnects the anode of diode 11 to the cathode of diode 12 while metal film 16 connects the anode of diode 12 to the cathode of diode 11. Enlarged portions 14t of film 14 and 16t of film 16 provide metal areas of about 8.5 square mils (5500 square microns) each to serve as termination pads to which, for example, 1 mil (0.025 mm) diameter gold wires may be thermocompression bonded.

The integrated circuit 10 is made by well known process steps. Briefly a silicon wafer 20 that is lightly doped with P-type impurities (about $3.5 \times 10^{15}$ atoms per cubic centimeter) has an epitaxial layer 22 grown over one of the major wafer surfaces that is simultaneously lightly doped with N-type impurities (about $3.5 \times 10^{15}$ atoms per cubic centimeter). After appropriate masking, p-type impurities are diffused into selected unmasked regions of the layer 22 to form a heavily doped isolation wall 23 through the layer 22 having a surface resistance of about 5 ohms per square), leaving two unaltered N-type epitaxial pockets 24 and 26.

Shallow annular regions 28 and 29 are formed by similar masking and diffusion steps in the pockets 24 and 26, respectively, to provide heavy constructions of N-type impurities (about $5 \times 10^{19}$ atoms per cubic centimeter). Likewise a heavy concentration of P-type impurities (providing a surface resistance of 200 ohms per square) are selectively diffused to form the annular regions 32 and 33 that are spaced internal of and concentric with annular regions 28 and 29, respectively. The annular regions 28 and 29 are necessary for providing ohmic contact of metal films 17 and 14, respectively, to the unaltered epitaxial material of pockets 24 and 26, respectively. A heavily doped N-type buried layer (not shown) may be provided at the interface between each of the pockets 24 and 26 and the wafer 20, being connected to concentric pocket contact regions 28 and 29, respectively, by heavily doped N-type plugs (not shown) to reduce the forward voltage drop at higher current levels in diodes 11 and 12. Regions 32 and 33 are not essential but are preferred to avoid surface conduction that tends to degrade the Schottky diodes 11 and 12.

A thin coating of silicon dioxide and/or other insulative material 34 is deposited on the epitaxial surface and selectively removed over small central surface means 35 and 36 of pockets 24 and 26, respectively. This permits direct contact of metal films 14 and 16, respectively, to unaltered epitaxial portions of pockets 24 and 26, respectively, to form a Schottky barrier at the metal-semiconductor interface, e.g. area 36 in diode 12.

Another opening is made in the insulative coating 34 in an area 40 over a portion of the isolation wall region 23 to permit direct ohmic contact of a third metal film 42.

The metal films 14, 16 and 42 are then formed by vacuum depositing aluminum metal over the entire coating 34 and removing unwanted portions of the aluminum by standard photolithographic masking selective etching steps. The film 42 serves as a terminal pad having an area of about 16 square mils (10,300 square microns).

Figure 3:
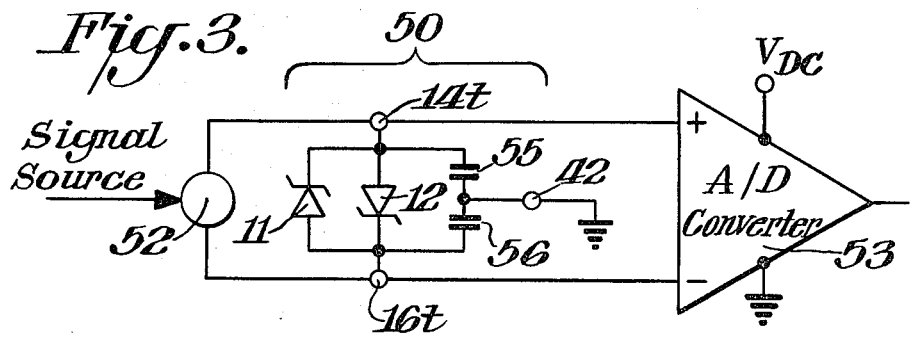
FIG. 3 shows a diagram of an equivalent circuit 50 of the integrated circuit of FIGS. 1 and 2, connected to the input of an analog to digital converter.

With reference to FIG. 3, the equivalent circuit 50 of the dual Schottky diode integrated circuit is shown connected across the output of signal source 52 and the input of an analog to digital converter 53. The capacitors 55 and 56 represent the capacitance between the isolation wall 23 and the epitaxial pockets 24 and 26, respectively.

What is claimed is:

1. A signal limiting integrated circuit comprising a silicon body of one conductivity type, an epitaxial layer on said body being lightly doped with impurities of the opposite conductivity type, an isolation wall through said epitaxial layer being heavily doped with impurities of said one type forming only two pockets of unaltered epitaxial material, only first, second and third metal films overlying said epitaxial layer, said first metal film making Schottky barrier contact to one of said pockets and ohmic contact to the other of said pockets, said second metal film making Schottky barrier contact to said other of said pockets and ohmic contact to said one pocket, each of said first and second metal films having an enlarged termination portion located directly over said pocket to which said Schottky barrier contact is made, said third metal film consisting of an enlarged termination located directly over an enlarged portion of said isolation wall and making ohmic contact thereto.

2. The integrated circuit of claim 1 wherein the area of each said termination pad portion is at least 5000 square microns.

3. The integrated circuit of claim 1 wherein the area of the p-n junction between said one pocket and said isolation wall is essentially equal to the p-n junction area between said isolation wall and said other pocket.

* * * * *